United States Patent [19]

Freeman

[11] 4,391,678

[45] Jul. 5, 1983

[54] METHODS OF MAKING INFRARED DETECTOR ARRAY COLD SHIELD

[75] Inventor: Wallace L. Freeman, Woodbridge, Va.

[73] Assignee: The United States of America as represented by the Secretary of the Army, Washington, D.C.

[21] Appl. No.: 322,503

[22] Filed: Nov. 18, 1981

[51] Int. Cl.[3] .......................... C25D 5/02; C25D 5/00
[52] U.S. Cl. .................................... 204/15; 204/38 B
[58] Field of Search ...................... 204/15, 38 B, 35 R

[56] References Cited

U.S. PATENT DOCUMENTS

| 2,834,723 | 5/1958 | Robinson | 204/15 |
| 3,622,469 | 11/1971 | Alberts et al. | 204/15 |
| 3,637,380 | 1/1972 | Hallman et al. | 96/35 |
| 3,962,778 | 6/1976 | Palmer | 29/572 |
| 3,963,926 | 6/1976 | Borrello | 250/332 |
| 3,978,580 | 9/1976 | Leupp et al. | 29/592 |
| 4,184,909 | 1/1980 | Chang et al. | 156/643 |
| 4,313,022 | 1/1982 | Jordan et al. | 136/244 |
| 4,366,229 | 12/1982 | Freeman | 430/312 |

FOREIGN PATENT DOCUMENTS 1122635  1/1962  Fed. Rep. of Germany .

*Primary Examiner*—T. M. Tufariello
*Assistant Examiner*—T. L. Williams
*Attorney, Agent, or Firm*—Robert P. Gibson; Milton W. Lee; Aubrey J. Dunn

[57] ABSTRACT

An infrared detector array is covered by an insulation subcoat atop which two metal layers are applied. The first layer is a thin sputtered or evaporated layer atop which the thick layer is electroplated. Holes through the metal layers uncover the individual detectors of the array.

4 Claims, 2 Drawing Figures

METHODS OF MAKING INFRARED DETECTOR ARRAY COLD SHIELD

The invention described herein may be manufactured, used, and licensed by the U.S. Government for governmental purposes without the payment of any royalties thereon.

BACKGROUND OF THE INVENTION

This invention is in the field of cold shields for infrared detector arrays. Such arrays consist of infrared detectors grown or otherwise formed or applied to an insulating or semiconductor substrate, and have the various bias and/or read-out electrical conductors on the substrate and connected to the detectors. The arrays may be either one or two dimensional, i.e. they may consist of a single line of detectors, or multiple parallel lines. In either event, the array is cryogenically cooled and infrared radiation from some desired field-of-view is directed thereon. In order to reduce the effects of radiations from sources outside the field of view and to help establish and maintain a substantially uniform detector temperature, a cold shield may be used. The cold shields currently used are perforated plates of insulation or of metal-coated insulation which are glued by hand into the substrate holding the detector array. Since the detector arrays now commonly used are small, it is necessary to perform the gluing operation under a microscope. The operation has several disadvantages, including the difficulty of applying a uniform glue line—a typical glue line may be less than a micrometer thick and several micrometers in length and width. Moreover, it requires skilled workers to apply the shields, and only one can be applied at a time. Also, the shields require a separate processing line for their fabrication from the line used to make the arrays. All of these disadvantges combine to yield a cold shield which is very expensive to produce, compared to the cold shield as invented by the instant inventor. Specifically, the instant invention includes steps compatible with the normal steps of making the array, requires no skilled hand labor, does not require separate facilities to produce the cold shield, and is thus much cheaper and easier than the prior art methods.

SUMMARY OF THE INVENTION

In order to make a cold shield for an array of infrared detectors, the detectors, their connecting leads and the side of the substrate on which such detectors and leads lie are first coated with a thin insulating subcoat. Atop this subcoat is evaporated or sputtered a thin metal layer. This metal layer may be electroplated with a relatively thick metal layer and this layer and the thin layer may be etched to uncover the subcoat over the detectors and regions of the leads, or the thin layer may be etched to uncover the subcoat over the detectors and region of the leads and the remaining thin metal layers electroplated with a relatively thick metal layer. Whichever method is used, the thick metal layer (with some contribution by the thin metal layer) acts as a cold shield for the detector array. Depending upon the material from which the subcoat is made, and other consideration, the uncovered substrate may be removed.

DESCRIPTION OF PREFERRED EMBODIMENTS

Figure 1:
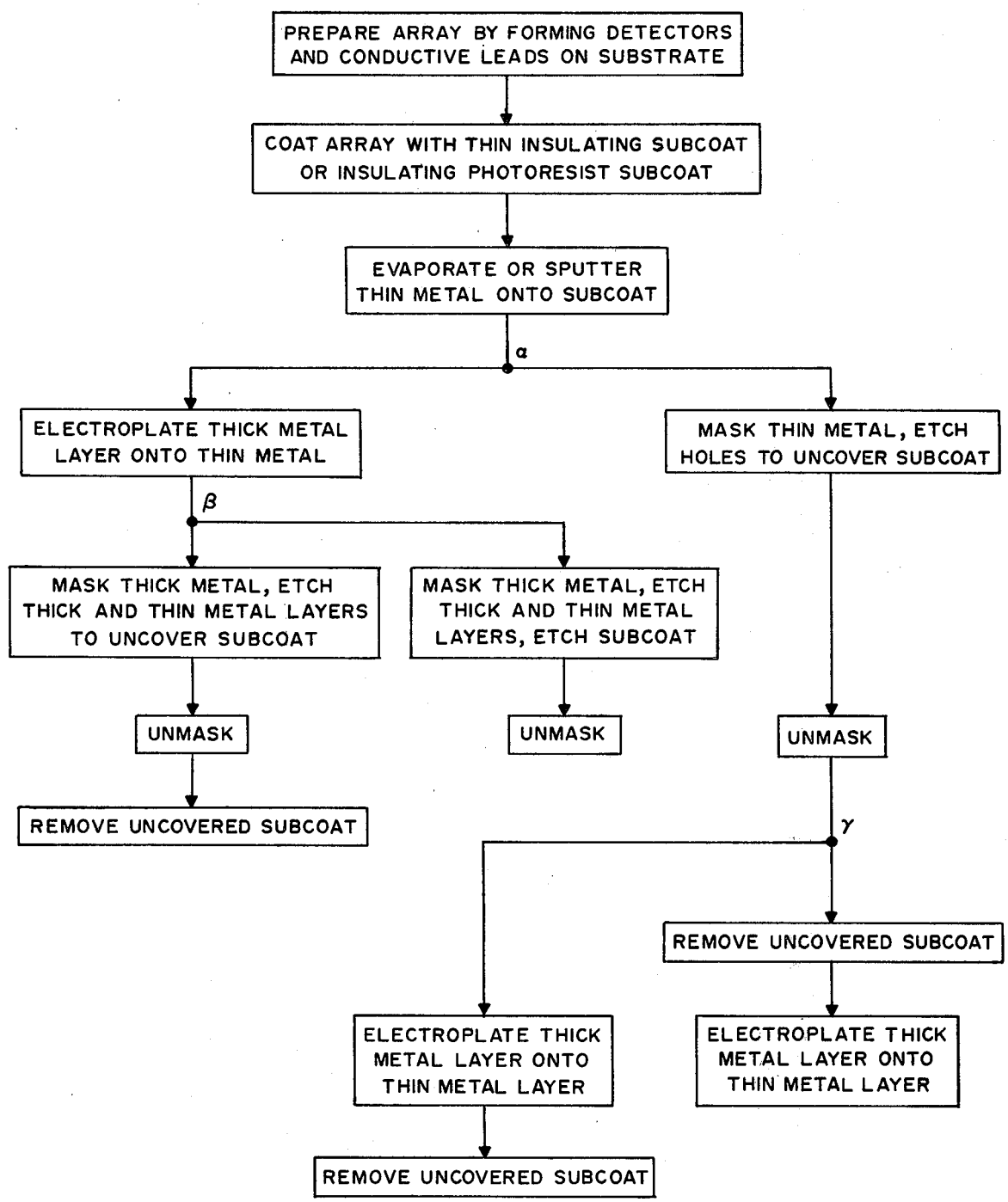
FIG. 1 is a flow chart of the inventive methods.

The invention may be best understood when this description is taken in conjunction with the drawings, in which the flow chart of FIG. 1 begins with the step of forming a detector array and connecting leads therefor on a substrate. For photoresistive or photoconductive detectors, the substrate is an insulator such as glass or sapphire. Other types of detectors may employ a semiconductor substrate with doped detector regions. The semiconductor substrate is coated with an insulator atop which connecting leads to the detector regions are applied. The invention is usable with all these variable type of detector arrays. The next step in this invention after the array is made is coating the array with a thin insulating subcoat. This subcoat may be merely an insulator such as silicon dioxide, an insulating antireflective layer such as zinc sulfide, or an insulating photoresist. In any event, this subcoat is deposited (as by evaporation or sputtering) to a thickness of about 1500 Å. Atop the subcoat one next deposits (as by evaporation or sputtering) a thin layer (2000 Å, for example) of metal such as aluminum, chromium, or indium. At this point (junction $\alpha$ on FIG. 1) the inventive method may proceed by either of two paths. In the left path as shown on the FIG. 1 flowchart, the thin metal layer is electroplated by a thick metal layer (5 mils) of a metal such as aluminum, chromium, or indium. Again, two paths may be taken (junction $\beta$): the thick metal may be masked (left-path) and both the thick and thin metal layers may be etched away to uncover the subcoat over each detector. The mask and the uncovered subcoat are then removed, either one first, or both simultaneously, depending upon the particular subcoat. For a photoresist subcoat, the subcoat must be exposed and developed, either before or after the mask is removed. If a simple insulating layer subcoat is used it may be removed by the same solvent used to remove the mask. However, if zinc sulfide or other antireflective layer is the substrate, it may be left in place. Returning to junction $\beta$, the right path includes the steps of masking the thick metal layer, and etching through the thick and thin metal layer and the subcoat to uncover the detectors. A subcoat which is etchable by the same etchant as the metal layers is the previously mentioned layer of zinc sulfide. Following the etching of this path, the thick metal is unmasked. Returning to junction $\alpha$, the right path includes the steps of masking the thin metal layer and etching holes therethrough to uncover the subcoat over the detectors. When the mask is removed, one reaches junction $\gamma$ from whence either of two paths may be followed. In the left path from junction $\gamma$, the first step is to electroplate a thick metal layer (5 mils) atop the thin metal layer, and the final step is to remove the uncovered subcoat, if desired. The right path from junction $\gamma$ reverses the steps of the left path.

Figure 2:
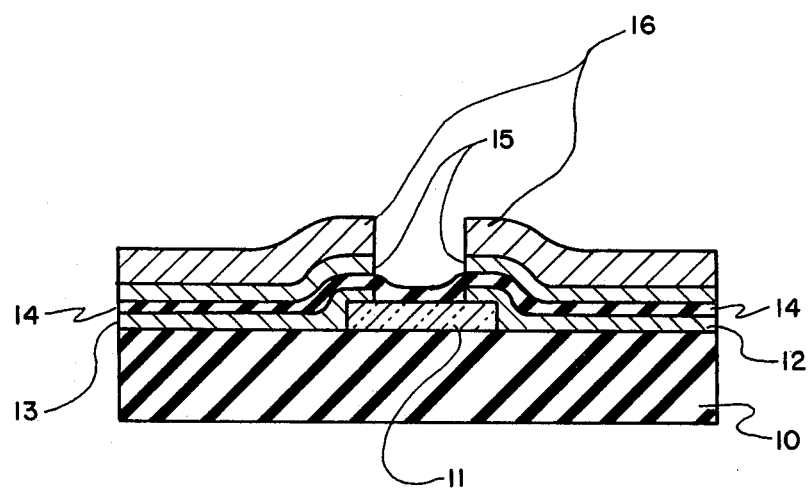
FIG. 2 is a cross-sectional view of a detector array made in accordance with the invention.

FIG. 2 shows how a cross-section of a detector array would appear after the inventive method is practiced. Reference numeral 10 designates the substrate upon which the array is made. The array includes detector such as 11 and connecting leads 12 and 13. Atop 11, 12 and 13 is insulating subcoat 14, with thin metal layer 15 on 14 and thick metal layer 16 on layer 15. As can be seen, the drawing is not to scale for the layer thicknesses previously mentioned. Moreover, the portion of layer 14 atop detector 11 has not been removed.

I claim:

1. A method of making a cold shield for an infrared detector array, wherein the array consists of a plurality of detectors and connecting leads on one side of a substrate, wherein the method includes the steps of:
    (a) coating said detectors, said leads, and one side of said substrate with a thin subcoat;
    (b) depositing a relatively thin metal layer on said subcoat;
    (c) electroplating a relatively thick metal on said thin metal layer;
    (d) masking said thick metal layer in accordance with said array and etching through said thick and thin metal layers to uncover the subcoat over the detectors and at least a portion of said leads; and
    (e) removing the mask.

2. A method of making a cold shield for an infrared detector array, wherein the array consists of a plurality of detectors and connecting leads on one side of a substrate, wherein the method includes the steps of:
    (a) coating said detectors, said leads, and one side of said substrate with a thin subcoat;
    (b) depositing a relatively thin metal layer on said subcoat;
    (c) masking said thin metal layer in accordance with said array and etching through said thin metal layer to uncover the sublayer over the detectors and at least a portion of said leads;
    (d) removing the mask; and
    (e) electroplating a relatively thick metal layer on said thin metal layer.

3. The method as set forth in either claim 1 or claim 2 wherein said subcoat is a photoresist layer.

4. The method as set forth in either claim 1 or claim 2 wherein the uncovered portions of said subcoat are removed.

* * * * *